(12) United States Patent
Ina et al.

(10) Patent No.: US 7,586,582 B2
(45) Date of Patent: Sep. 8, 2009

(54) EXPOSURE APPARATUS

(75) Inventors: Hideki Ina, Toshima-ku (JP); Koichi Sentoku, Kawachi-gun (JP); Gaku Takahashi, Ustunomiya (JP); Yoshinori Miwa, Ustunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 79 days.

(21) Appl. No.: 11/462,175

(22) Filed: Aug. 3, 2006

(65) Prior Publication Data

US 2007/0035708 A1 Feb. 15, 2007

(30) Foreign Application Priority Data

Aug. 9, 2005 (JP) ............... 2005-230840

(51) Int. Cl.
*G03B 27/42* (2006.01)

(52) U.S. Cl. ......................................... 355/53; 355/30

(58) Field of Classification Search ................ 355/30, 355/53, 72
See application file for complete search history.

(56) References Cited

U.S. PATENT DOCUMENTS

| 6,507,388 | B2 | 1/2003 | Burghoorn | |
|---|---|---|---|---|
| 6,616,898 | B2 * | 9/2003 | Hara et al. | 422/112 |
| 6,842,220 | B1 * | 1/2005 | Dishon et al. | 355/27 |
| 6,876,436 | B2 | 4/2005 | Burghoorn | |
| 7,185,992 | B2 * | 3/2007 | Yoshizawa | 359/513 |
| 7,305,015 | B2 * | 12/2007 | Uto et al. | 372/22 |
| 2001/0052967 | A1 * | 12/2001 | Ogura et al. | 355/53 |
| 2003/0206280 | A1 * | 11/2003 | Murayama et al. | 355/30 |

FOREIGN PATENT DOCUMENTS

| JP | 2000-227358 A | 8/2000 |
|---|---|---|
| JP | 2001-217191 A | 8/2001 |

* cited by examiner

*Primary Examiner*—Diane I Lee
*Assistant Examiner*—Mesfin T Asfaw
(74) *Attorney, Agent, or Firm*—Canon USA Inc IP Division

(57) ABSTRACT

At least one exemplary embodiment is directed to an exposure apparatus which includes a chamber, an evacuating device configured to evacuate the chamber, a sensor configured to measure at least any one of the position and the height of a substrate, and a cover for hermetically sealing at least part of the sensor.

3 Claims, 5 Drawing Sheets

EXPOSURE APPARATUS

BACKGROUND OF THE INVENTION

1. Field of the Invention

The present invention relates to measuring devices, and in particular, though not exclusively, measuring devices for use in an exposure apparatus and to a wafer alignment device.

2. Description of the Related Art

In order to fabricate fine semiconductor elements, such as a semiconductor memory and logic circuits, a reduction projection exposure process using a UV ray has been performed.

The minimum object dimension to be transferred by the reduction projection exposure is proportional to the wavelength of light used for transferring, and is inversely proportional to the numerical aperture of a projection optical system. Hence, the reduction in wavelength of a light ray for used in transferring fine circuit patterns has been promoted, so that wavelengths of used UV rays have been reduced, such as a mercury lamp i-ray (wavelength 365 nm), KrF excimer laser (248 nm), and ArF excimer laser (193 nm).

However, with the rapid miniaturization of semiconductor elements, the size needed has resulted in a limit in ability of lithography using UV light. Thus, for efficiently exposing circuit patterns as small as 42 nm in size, exposure apparatus's have been proposed using an EUV (extreme ultra violet) ray with a wavelength of 10 to 15 nm, which is further smaller than that of the UV ray.

Since a light ray with a wavelength of 10 to 15 nm is very largely absorbed by a substance, lens optical systems using visible light or UV light, typically have light refraction levels that are unusable, thus reflection optical systems are used in exposure apparatuses using the EUV ray. In this case, a reflection-type reticle having a pattern to be transferred formed on a mirror with an absorber is also used.

Furthermore, since the EUV ray is generally absorbed in the atmosphere and attenuated, it needs to be used under vacuum. Thus, the exposure apparatus includes a vacuum chamber evacuated inside. In such an exposure apparatus, use of electronic instruments arranged inside the vacuum chamber is limited. For example, an electronic instrument can malfunction under the vacuum or solder used in an electric circuit can emit pollutant.

Japanese patent Laid-Open No. 2001-217191 discuses an exposure apparatus, where parts of elements of an alignment system for aligning a wafer to a mask is arranged outside the vacuum chamber. The part includes a laser module and a photo-detector. When doing so, the configuration of the apparatus is largely limited. In general, vacuum-enabled measuring devices are inferior in accuracy than normal measuring devices, so that to use these devices is inappropriate.

SUMMARY OF THE INVENTION

An exposure apparatus according to at least one exemplary embodiment of the present invention includes a chamber, an evacuating device for evacuating the chamber, an optical system for measuring at least any one of the position and the height of a substrate, and a cover for sealing at least part of the optical system, the cover includes a transparent plate, through which measurement light from the optical system passes, and a pressure controlling device for controlling the pressure of a space in the cover.

According to at least one exemplary embodiment of the present invention, in an exposure apparatus for exposing an element to light under a vacuum atmosphere, an alignment sensor and a focus sensor can be used.

At least one exemplary embodiment is directed to measuring devices for use in an exposure apparatus for exposing fine elements to light under a vacuum atmosphere, and additionally relates to a wafer alignment device and a wafer focus measuring device in the exposure apparatus using an EUV (extreme ultra violet) ray as light for exposure.

Further features of the present invention will become apparent from the following description of exemplary embodiments with reference to the attached drawings.

DESCRIPTION OF THE EMBODIMENTS

Figure 1:
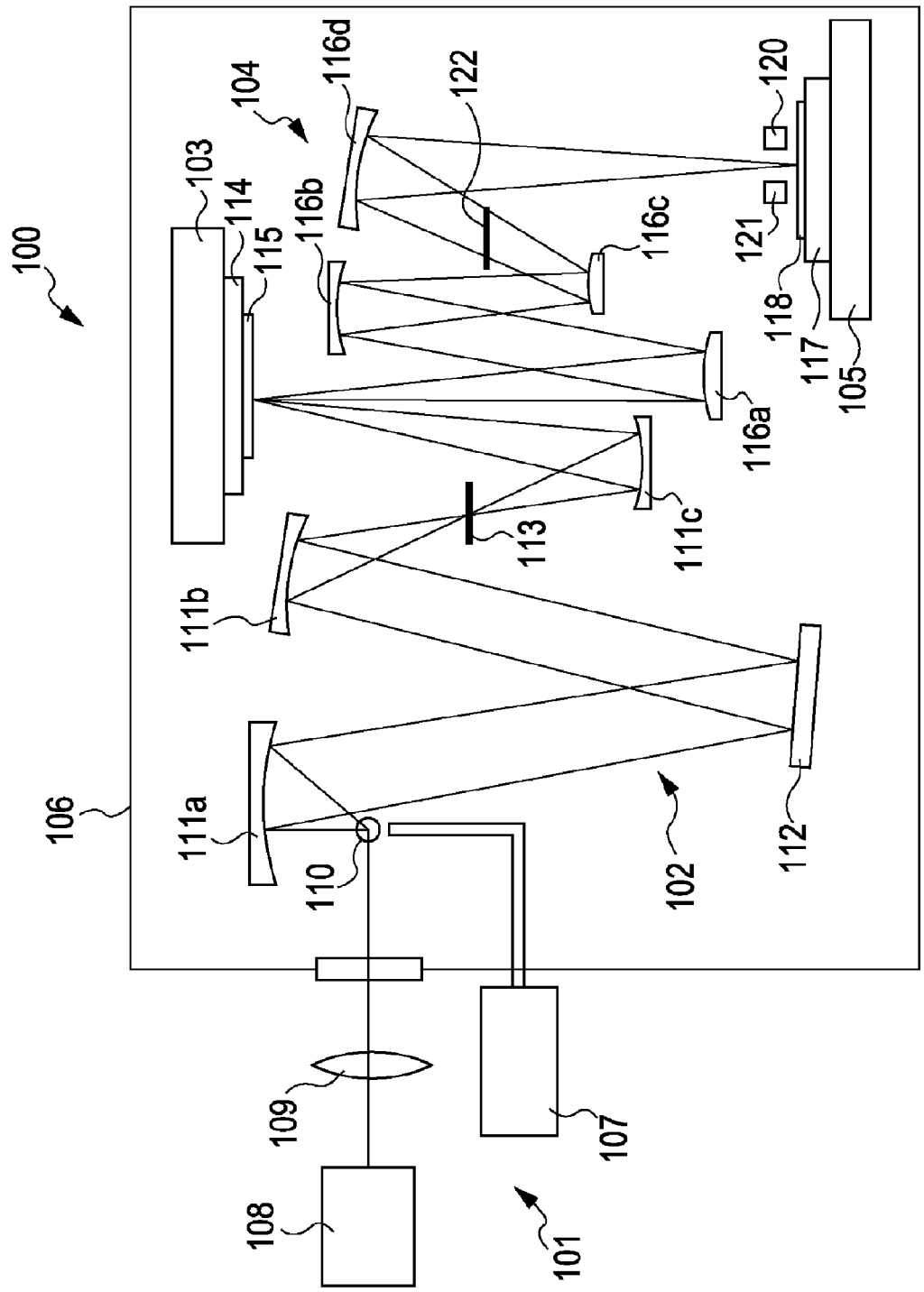
FIG. 1 is a drawing of an exposure apparatus.

The following description of at least one exemplary embodiment is merely illustrative in nature and is in no way intended to limit the invention, its application, or uses.

Processes, techniques, apparatus, and materials as known by one of ordinary skill in the relevant art can not be discussed in detail but are intended to be part of the enabling description where appropriate, for example the fabrication of the mirror elements and their materials.

In all of the examples illustrated and discussed herein any specific values, for example the radius of curvature, should be interpreted to be illustrative only and non limiting. Thus, other examples of the exemplary embodiments could have different values.

Notice that similar reference numerals and letters refer to similar items in the following figures, and thus once an item is defined in one figure, it can not be discussed for following figures.

Note that herein when referring to correcting or corrections of an error (e.g., an aberration), a reduction of the error and/or a correction of the error is intended.

First Exemplary Embodiment

An exposure apparatus according to an exemplary embodiment of the present invention will be described with reference to FIG. 1. The exposure apparatus 100 includes a light emission unit 101, an illumination optical system 102, a reticle stage 103, a projection optical system 104, a wafer stage 105, and a vacuum chamber 106 covering these components.

The light emission unit 101 includes a target illuminating device 107 and a pumping pulse laser illuminating device 108. A target material fed within the vacuum chamber 106 can be irradiated with pulse laser via a condenser lens 109 so as to generate hot plasma 110, emitting EUV light. The target material can include a metallic thin film, an inert gas, liquid droplets and other target material as known by one of ordinary relevant skill and equivalents. The target illuminating device 107 can for example include a gas jet. For increasing the average intensity of the emitted EUV light, the repetition frequency of the pulse laser can be higher, so that the apparatus can be generally operated at a repetition frequency of several KHz.

The illumination optical system 102 includes a plurality of mirrors 111a-c (multi-layer mirrors or grazing incidence mirrors) and an optical integrator 112. Any one of the plurality of mirrors 111*a-c* condenses the emitted EUV light. The optical integrator 112 is provided for uniformly illuminating a reticle (mask) with a predetermined numerical aperture. Also, at a position conjugated with the reticle of the illumination optical system, an aperture 113 is provided for shaping the reticle illuminating region in an arch.

The reticle stage 103 and the wafer stage 105 include a scanning mechanism configured to scan the stages synchronously at a speed ratio which is in proportion to a reduction magnification. The scanning direction herein is designated as X; the direction perpendicular to a reticle surface and a wafer surface is designated as Z; and the direction perpendicular to the directions X and Z is designated as Y.

The reticle stage 103 includes a reticle chuck 114 so as to hold a reticle 115 with the reticle chuck 114, and it also includes a driving device configured to drive a move in the X direction at a long stroke. Also, in directions X, Y, and Z and in rotational directions about the respective axes, driving device(s) are configured to drive a move at a short stroke. Providing such a roughly driving mechanism and a fine-adjustment mechanism enables the reticle 115 to be positioned with high accuracies. The position and the altitude (inclination) of the reticle stage 103 are measured with a laser interferometer, and are controlled based on the measured results.

The projection optical system 104 includes a plurality of mirrors 116*a-d*. Although the smaller the number of the mirrors, the utilization efficiency of the EUV light is increased, the aberration correction can be difficult when the number of the mirrors is small. The number of the mirrors useful for correcting the aberration can be about 4 to 6. The shape of the reflection surface of the mirror can be convex, concave, spherical or aspheric. The numerical aperture NA of the mirror can be about 0.1 to 0.3.

The mirror can be made of a material with high rigidity and hardness and a low thermal expansion coefficient such as low expansion glass or silicon carbide or other materials as known by one of ordinary skill in the relevant arts and equivalents. A substrate made of the material can be ground and polished so as to form a predetermined reflection surface, and then, the reflection surface can be coated (e.g., with molybdenum and silicon) to form a multilayer. If the incident angle is not constant depending on the position in mirror plane, in the multilayer with constant layer cycle, the reflection factor is increased depending on the position, so that the wavelength of the EUV light is displaced. Thus, the layer cycle is non-uniformly distributed so that the EUV light with the same wavelength is efficiently reflected in mirror plane.

In order to reduce the EUV light emitted from the light emission unit 101 from attenuating until it is led to a wafer 118, the pressure in the vacuum chamber can be maintained from $10^{-5}$ to $10^{-4}$ Pa.

The exposure apparatus described above includes a plurality of alignment sensors 121 arranged between the wafer 118 and the reticle 115 or on the wafer 118 for aligning components between exposure shots, and a focus sensor 120 for aligning the wafer with the focal position of a reticle pattern.

Figure 2:
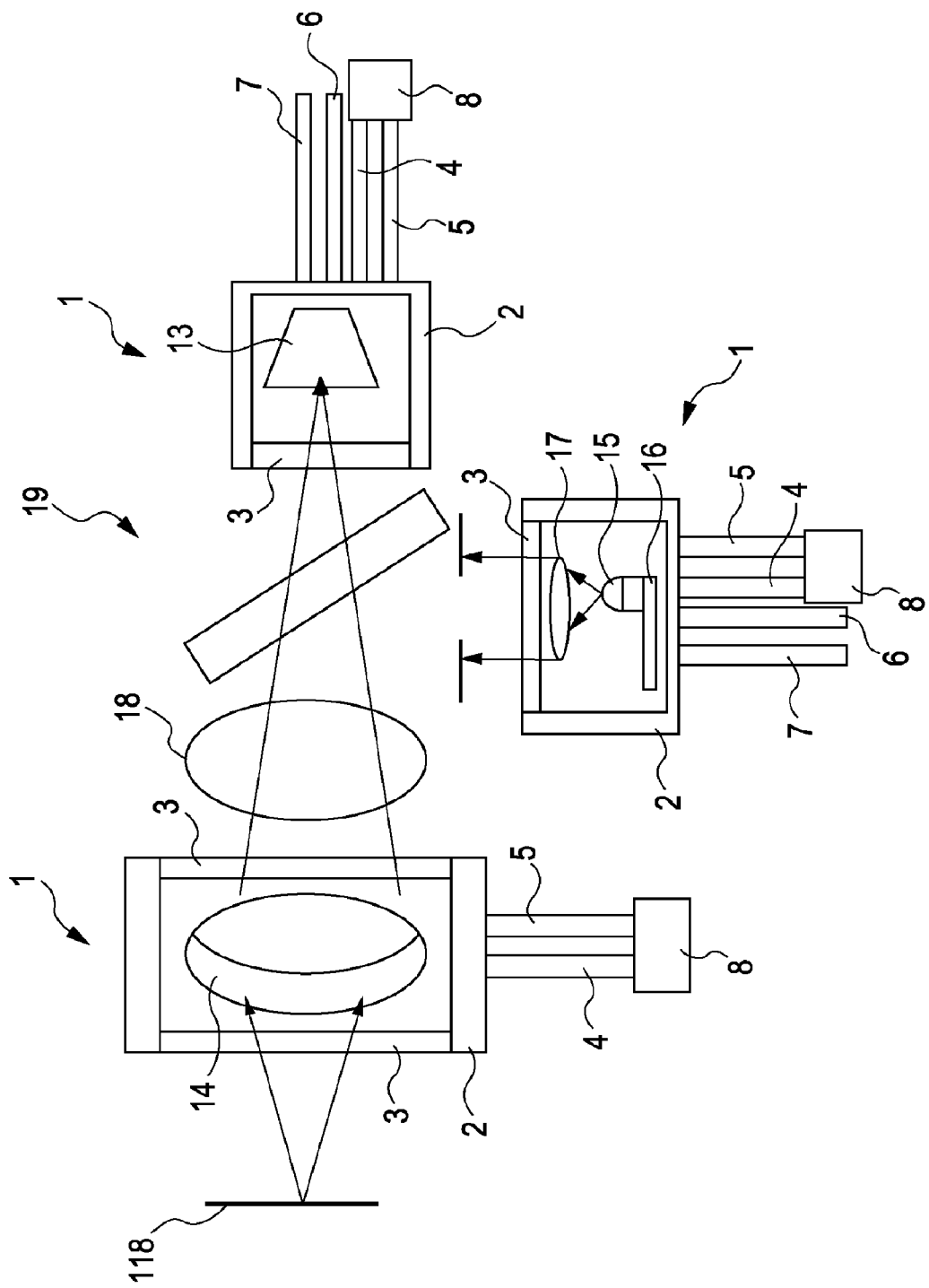
FIG. 2 is a drawing of an alignment detection system according to a first exemplary embodiment.

FIG. 2 shows the alignment sensor 121, which includes a light source 15, an introducing device 19 configured to introduce the light emitted from the light source 15 to the wafer, lenses 14 and 18, and a CCD camera (or other imager as known by one of ordinary skill in the relevant arts and equivalents) 13. Components are aligned by an off-axis system. The light source 15 includes an LED, and a lens 17 and an electric circuit board 16 are arranged in the vicinity of the light source 15.

A lens pair 14 of two lenses bonded together with an adhesive and a single lens 18 can be used for focusing the alignment mark formed on the wafer 118 on the imager.

According to at least one exemplary embodiment, the CCD camera 13, the lens pair 14, and the light source 15 are arranged within hermetic covers 1, respectively. The hermetic cover 1 can include a supply pipe 4 configured to supply gas and a discharge pipe 5 configured to discharge gas connected thereto for maintaining atmospheric circumstances. An electric cable 6 can be used to supply electric power to electronic instruments such as the CCD camera 13 within the hermetic cover 1 and a signal line 7 for sending/receiving signals. These electric cable and signal line(s) can also be arranged in the supply pipe or the discharge pipe.

The hermetic cover 1 includes a casing 2 and a transparent plate 3, such as a glass plate, configured to allow detection light to pass through. For sealing the space formed by the casing 2 and the transparent plate 3, an O-ring and a gasket can be used. The hermetic cover 1 for the lens pair is provided with the two transparent plates 3 for incident and emitting lights.

Even when the sealing mechanism described above is provided, if a period of using time is over one month, gas within the hermetic cover 1 can gradually leak away. When the gas within the hermetic cover 1 leaks, the pressure difference between the inside and outside of the hermetic cover 1 is changed, causing the deflection of the transparent plate 3 to change.

If the deflection of the transparent plate 3 is changed, the focusing performance of the light passing through the transparent plate 3 is changed. Specifically, distortion, curvature of field, and coma are generated, deteriorating accuracies in alignment and focus detection. The deflection can be suppressed by increasing the thickness of the transparent plate 3; however, the thickness can have a practical design limit.

According to at least one exemplary embodiment, by controlling the amount of gas passing through the supply pipe 4 and the discharge pipe 5 by a pressure controlling device (the controlling device 8 in the drawing), the pressure variations within the hermetic cover 1 can be suppressed. The pressure herein can also be directly detected by providing a pressure sensor in the hermetic cover 1. The increase in temperature due to the heating of electronic instruments, such as the CCD camera, can be suppressed by controlling the temperature of gas passing through by a temperature controlling device (the controlling device 8 in the drawing).

Furthermore, by obtaining the deflection of the transparent plate 3, the lenses are designed so as to cancel and/or reduce the aberration due to the deflection. The method for obtaining the deflection can include a simulation, such as a finite element method, and the direct experimental measurement by a measuring device such as a laser interferometer. In designing the lenses, specifically, the aberration can be varied by changing the curvature, thickness, and material of the lens.

According to at least one exemplary embodiment, electronic instruments are arranged within the hermetic cover 1 so that the deterioration of vacuum atmosphere due to pollutants and gas emitted from components constituting the electronic instruments can be reduced. For example, since solder of an electronic circuit can cause the pollutants, the electronic circuit can be arranged within the hermetic cover 1. The operation defect of the electronic instrument due to the vacuum can also be prevented and/or reduced. In general, vacuum-enabled electronic instruments are inferior in performance than normal ones, so that the improvement in performance can also be expected according to the exemplary embodiment.

Also, according to at least one exemplary embodiment, by arranging the lens pair 14 within the hermetic cover 1, the lenses can be cemented with an adhesive. By cementing a plurality of lenses together, the chromatic aberration of the alignment sensor can be effectively corrected.

Second Exemplary Embodiment

Figure 3:
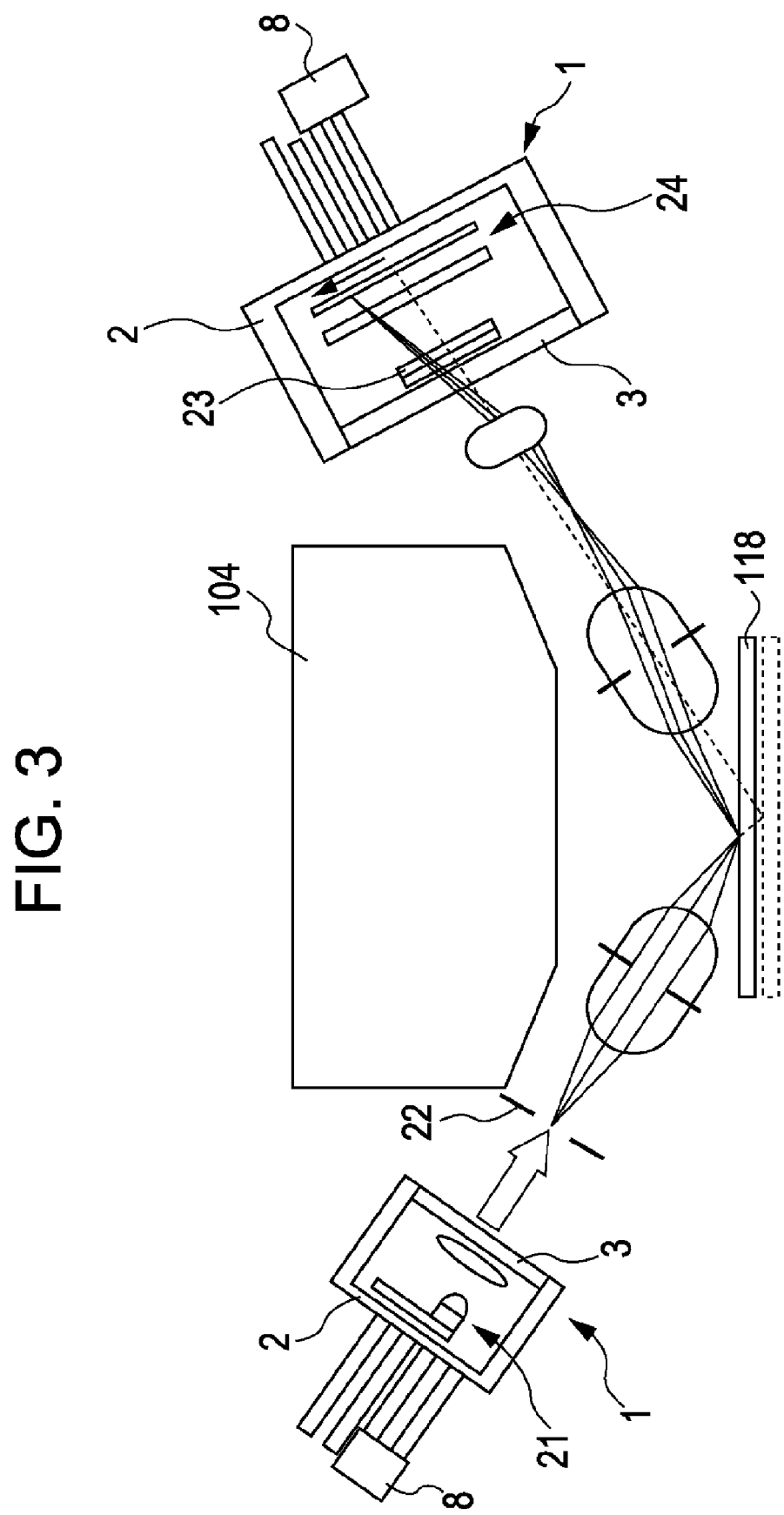
FIG. 3 is a drawing of a focus detection system according to a second exemplary embodiment.

Another exemplary embodiment in that the hermetic cover is applied to a focus sensor and will be described with reference to FIG. 3. Like characters designate like components and their description is omitted, which are the same as the first exemplary embodiment.

The focus sensor 120 includes a light source 21, a plurality of slit-like marks 22, a cylindrical mirror 23, and a CCD camera (imager) 24.

The light source 21 includes an LED. The light emitted from the light source 21 passes through the slit and is reflected by the surface of the wafer 118 so that the mark is focused on the imager. In such a structure, the wafer 118 is aligned with the focal point of the projection optical system while being driven with the wafer stage in an optical axial direction.

In such a focus sensor, the light source 21 and the CCD camera 24 can be arranged within the hermetic cover 1. Since the structure of the hermetic cover 1 is the same as that of the first exemplary embodiment, the detailed description is omitted.

Exemplary Embodiment of Device Manufacturing Method

Figure 4:
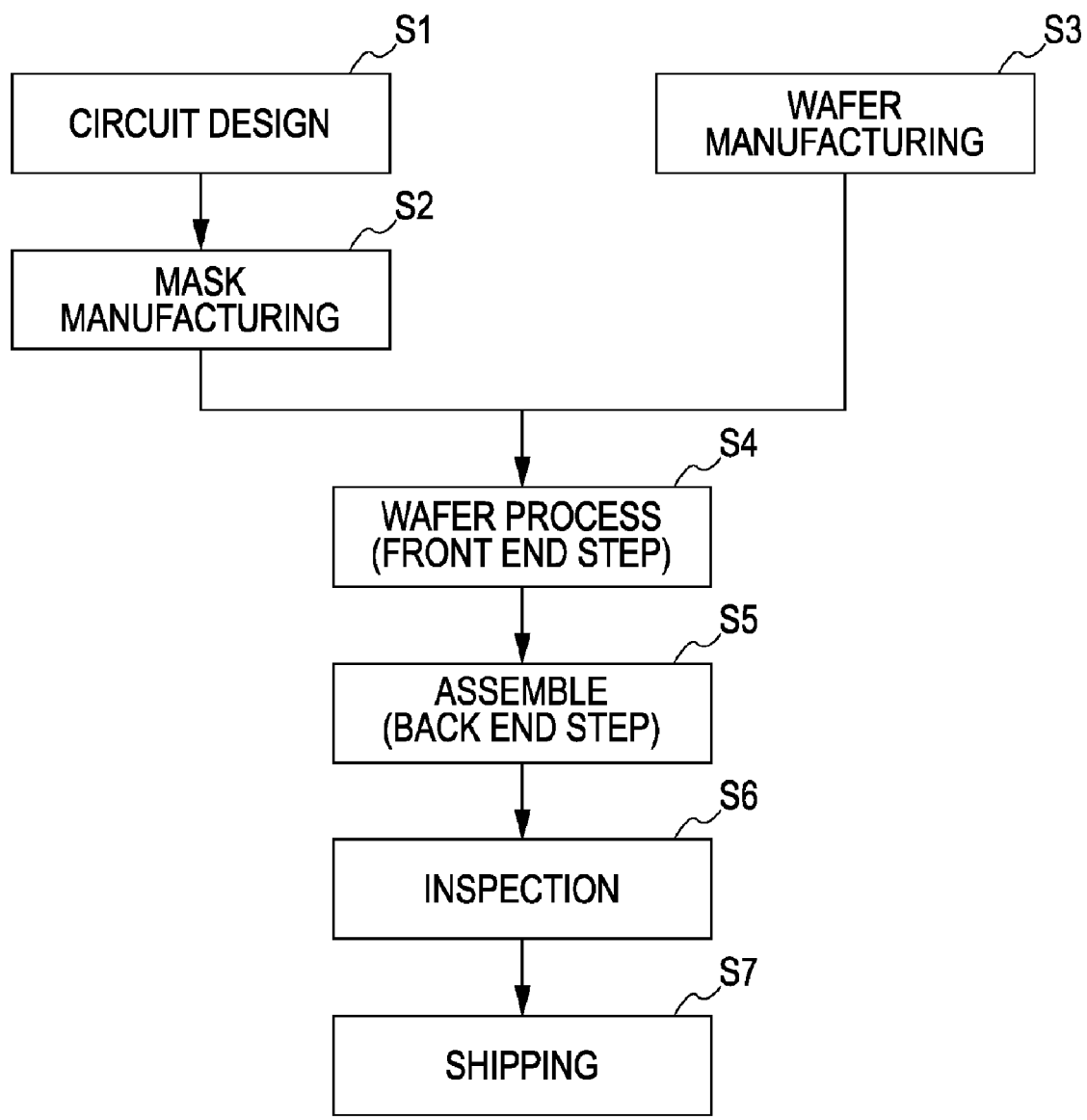
FIG. 4 is a flowchart of a device manufacturing method.

An exemplary embodiment of a method for manufacturing a device using the exposure apparatus described above will be described with reference to FIGS. 4 and 5. FIG. 4 is a flowchart illustrating the manufacturing the device (a semiconductor chip such as an IC or an LSI, an LCD, and a CCD). A method for manufacturing a semiconductor chip is herein described.

At step S1 (circuit design), the circuit of the semiconductor device is designed. At step S2 (mask manufacturing), a mask is manufactured according to a designed circuit pattern. At step S3 (wafer manufacturing), a wafer is manufactured with a material such as silicon. At step S4 (wafer process called a front end step), a practical circuit is formed on the wafer using the mask and the wafer with the exposure apparatus by utilizing a lithography technique. Step S5 (assemble), called a back end step, is configuring the wafer manufactured at step S4 in semiconductor chips, and including an assembly process such as assembly steps (dicing and bonding) and a packaging step (chip encapsulation). At step S6 (inspection), the inspection of the semiconductor device manufactured at step S5 is performed, such as an operation check and a torture test. The semiconductor device completed after such steps is shipped (step S7).

Figure 5:
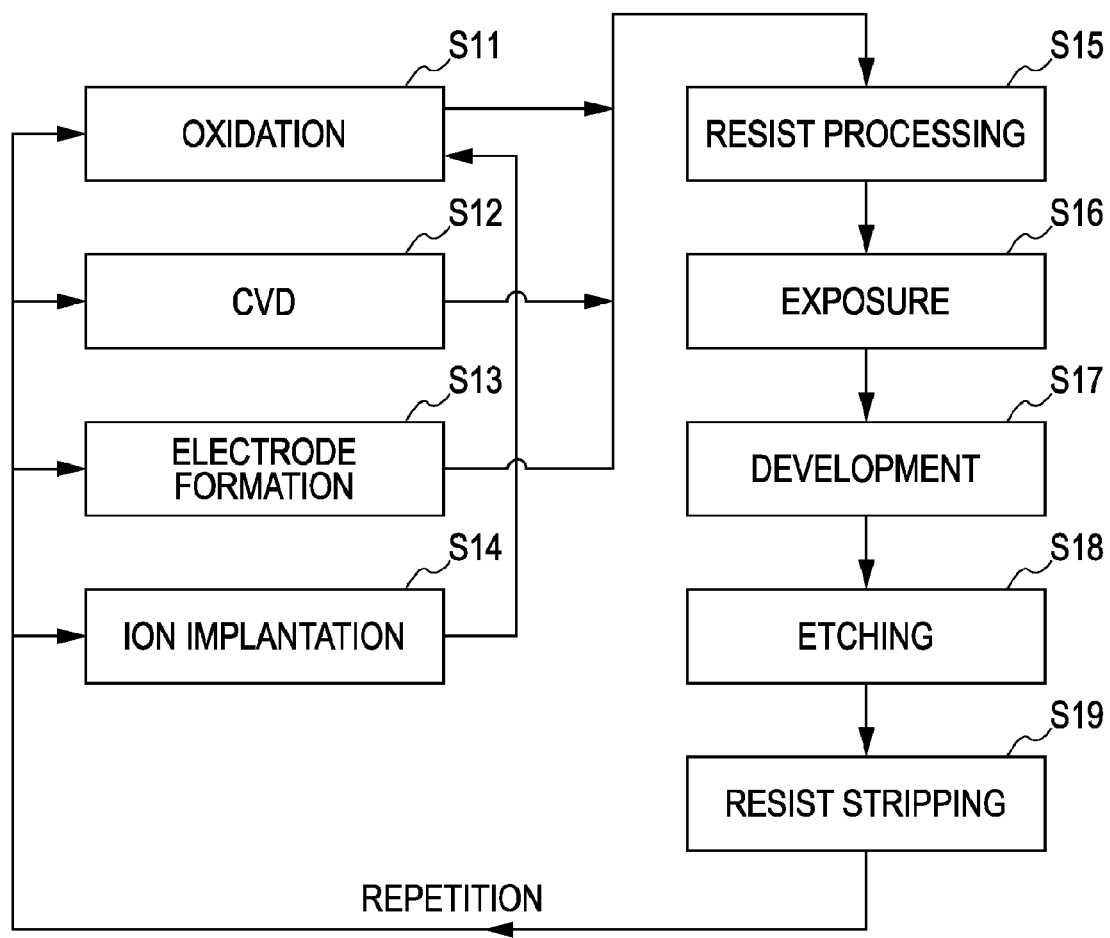
FIG. 5 is a drawing of a wafer process.

FIG. 5 is a flowchart of a detailed process to the front end step (step S4) from the upstream. At step S11 (oxidation), the surface of the wafer is oxidized. At step S12 (CVD), an insulation film is formed on the surface of the wafer. At step S13, an electrode is formed on the surface of the wafer. At step S14 (ion implantation), ions are implanted into the wafer. At step S15 (resist processing), the wafer is coated with a sensitizer. At step S16 (exposure), a circuit pattern of the mask is exposed to light and aligned on the wafer with the exposure apparatus. At step S17 (development), the exposed wafer is developed. At step S18 (etching), parts other than the developed resist images are scraped away. At step S19 (resist stripping), unnecessary resists after the etching are removed. By repeating these steps, circuit patterns are formed in a multilayer on the wafer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-230840 filed Aug. 9, 2005, which is hereby incorporated by reference herein in its entirety.

What is claimed is:

1. An exposure apparatus for exposing a substrate to light under a vacuum atmosphere, the apparatus comprising:
    a vacuum chamber;
    an evacuating device configured to evacuate the vacuum chamber;
    a sensor arranged in the vacuum chamber and configured to measure at least any one of the position and the height of a substrate;
    a cover arranged in the vacuum chamber and configured to contain and hermetically seal at least part of the sensor, the cover including a transparent plate, through which measurement light from the sensor passes;
    a supply pipe connected to the cover and configured to supply gas to a space in the cover;
    a discharge pipe connected to the cover and configured to discharge gas from the space in the cover; and
    a pressure controlling device configured to control an amount of gas supplied by the supply pipe and discharged by the discharge pipe so that the pressure of the space in the cover is maintained equal to an atmospheric pressure.

2. A method for manufacturing a device comprising the steps of:
    exposing a substrate to light under a vacuum atmosphere using an exposure apparatus, the exposure apparatus comprising:
        a vacuum chamber;
        an evacuating device configured to evacuate the vacuum chamber;
        a sensor arranged in the vacuum chamber and configured to measure at least any one of the position and the height of a substrate;
        a cover arranged in the vacuum chamber and configured to contain and hermetically seal at least part of the sensor, the cover including a transparent plate, through which measurement light from the sensor passes;
        a supply pipe connected to the cover and configured to supply gas to a space in the cover;
        a discharge pipe connected to the cover and configured to discharge gas from the space in the cover; and
        a pressure controlling device configured to control an amount of gas supplied by the supply pipe and discharged by the discharge pipe so that the pressure of the space in the cover is maintained equal to an atmospheric pressure; and
    developing the exposed substrate.

3. The apparatus according to claim 1, wherein the pressure controlling device controls the pressure of the space in the cover so as to correct aberration resulting from deflection of the transparent plate.

* * * * *